United States Patent [19]

Dautriche

[11] Patent Number: 5,283,438
[45] Date of Patent: Feb. 1, 1994

[54] MONOLITHIC INFRARED DETECTOR WITH PYROELECTRIC MATERIAL

[75] Inventor: Pierre Dautriche, Claix, France

[73] Assignee: Thompson Composants Militaires et Spatiaux, Courbevoie, France

[21] Appl. No.: 804,747

[22] Filed: Dec. 11, 1991

[30] Foreign Application Priority Data

Dec. 11, 1990 [FR] France .................. 90 15476

[51] Int. Cl.⁵ ................................. H01L 27/14
[52] U.S. Cl. ................................. 250/338.3
[58] Field of Search ............... 204/165; 250/338.3

[56] References Cited

U.S. PATENT DOCUMENTS

| | | | |
|---|---|---|---|
| 3,885,301 | 5/1975 | Murayama | 204/165 |
| 4,024,560 | 5/1977 | Miller et al. | 357/23.15 |
| 5,087,816 | 2/1992 | Robin et al. | 250/338.3 |

FOREIGN PATENT DOCUMENTS

| | | | |
|---|---|---|---|
| 275801 | 2/1990 | German Democratic Rep. | 250/338.3 |
| 2-91525 | 3/1990 | Japan | 250/338.3 |
| 2200246 | 7/1988 | United Kingdom | |

OTHER PUBLICATIONS

Ferroelectrics, vol. 91, 1989, U.S. pp. 127-139; M. Okuyama et al.: 'Pyroelectric IR-CCD image sensor'.
SPIE, Infrared Detectors and Arrays, vol. 930, 1988 pp. 151-163; N. Butler et al, "Ambient temperature solid state pyroelectric IR imaging arrays".
Infrared Phys. vol. 22, 1982, GB pp. 259-275; R. Watton et al: 'The pyroelectric/CCD focal plane hybrid: Analysis and design for direct charge injection'.

Primary Examiner—Constantine Hannaher
Attorney, Agent, or Firm—Oblon, Spivak, McClelland, Maier & Neustadt

[57] ABSTRACT

Infrared detectors whose detecting part consists of a layer of pyroelectric material deposited on a semiconductive substrate are disclosed. The object is to facilitate the polarization of the layer of pyroelectric material after it is deposited on the semiconductive substrate. The detector of the invention includes a semiconductive substrate (15) carrying a layer of pyroelectric material (11) in which are defined zones, each corresponding to a pixel (P1 to P9). Each pyroelectric zone is defined by an electrode known as lower electrode (EI 1 to EI 9), in contact with a face of pyroelectric layer (11) oriented toward substrate (15). According to a characteristic of the invention, a diode known as polarization diode (DP) is formed in substrate (15) for each pixel (P1 to P9). The polarization diode is connected to lower electrode (EI 1 to EI 9) to make possible the passage of a current between substrate (15) and the lower electrode.

14 Claims, 4 Drawing Sheets

MONOLITHIC INFRARED DETECTOR WITH PYROELECTRIC MATERIAL

BACKGROUND OF THE INVENTION

1. Field of the Invention

The invention relates to infrared, in particular matrix, detectors, of the type produced according to a monolithic structure with pyroelectric materials.

2. Discussion of the Background

In infrared imagery, it is usual to use pyroelectric material to produce the detecting structure itself, and to add this detecting structure to a charge transfer multiplexer or in abbreviated form CCD ("Charge Coupled Device").

The CCD multiplexer is produced on a semiconductive substrate, separate from the detecting structure, with a base of pyroelectric materials, so that the infrared detecting unit constitutes a hybrid structure.

Such infrared detecting units are described in patent document GB 2 200 246 and in the article "Ambient temperature solid state pyroelectric IR imaging arrays" of N. BUTLER, J. McCLELLAND and S. IWASA, published in SPIE vol. 930, Infrared Detectors and Arrays, 1988, pages 151 to 163.

These infrared detecting units are generally surface units making it possible to produce an image comprising a plurality of elementary points placed in lines and in columns. These elementary points, also called pixels, correspond to a given element or given zone of the pyroelectric material.

Generally, a layer of material absorbing the infrared radiation is in contact with the pyroelectric elements. The thermal energy produced by the dissipation of the infrared radiation is sent to the pyroelectric elements, which produce electric charges which are thus proportional to the intensity of the radiation to which the corresponding pixel has been subjected.

The reading of the amounts of charges called "signal charges" produced by each of the pixels, during an exposure phase of the detector, is performed with a read circuit to which all the various amounts of signal charges (or equivalent values) are transferred successively with the CCD multiplexer.

FIG. 1 diagrammatically illustrates the manner by which the transfer of charges to a read circuit in a standard infrared detecting unit is performed. The detecting unit comprises a detecting surface formed by n pyroelectric zones Z1 to Zn (n being equal to 16 in the example) placed in lines L1 to L4 and in columns C1 to C4. The detecting surface is associated with a CCD type multiplexer comprising as many shift registers called column registers as there are columns C1 to C4. Each column register R1 to R4 comprises as many stages ET1 to ET4 as there are lines L1 to L4 so that stage of a column register corresponds to each pyroelectric zone Z1 to Zn or pixel. Each pyroelectric zone Z1 to Zn is connected to the corresponding stage of a column register with an acquisition and charge transfer circuit, called intermediate transfer circuit CT1 to CTn. The function of each intermediate transfer stage is to collect the signal charge (or an amount of charges proportional to this signal charge), and to transfer it in stage ET1 to ET4 of corresponding column register R1 to R4.

There therefore exist as many intermediate circuits CT1 to Ctn as there are pyroelectric zones.

According to a usual operation, the signal charges produced at the level of each pyroelectric zone Z1 to Zn (or a corresponding value) are transferred in the input stage of the intermediate transfer circuit, by which they are then transferred to corresponding reading stage ET1 to ET4 of register R1 to R4. This transfer of charges is performed in a first direction represented by an arrow 4. Since all the signal charges are charged in stage ET1 to ET4 of a column register R1 to R4, these column registers are actuated to transfer these charges in the direction shown by arrow 5, to a reading stage EL1 to EL4 of another shift register called read register RL.

Each column C1 to C4, i.e., each column register, corresponds to a reading stage EL1 to EL4 of read register RL. Thus, for example, the first transfer step of the column registers has the effect, in reading stages EL1 to EL4, of charging the charges originating respectively in pyroelectric zones Z13, Z14, Z15, Z16.

When all these charges are contained in read register RL, the latter, in turn, is actuated to transfer these charges into a read circuit CL, which performs the reading one after the other, and delivers, for each of these charges, an output signal, generally in the form of a voltage proportional to the value of each of the charge amounts. This operation is repeated until the charges produced in the pixels of first line L1 are in turn transferred, in parallel, into read register RL, then transferred by the latter into read circuit CL.

Such infrared detecting units with hybrid structure are relatively difficult to produce, and as a result have a very high cost, in particular because of difficulties linked to the assembly of the detecting structure with the semiconductive structure. Thus, for example, in some cases, the pyroelectric zones consist of as many separate elements as there are elementary image points or pixels. Further, these pyroelectric elements are to be carried by the semiconductive substrate, on which is formed the CCD multiplexer, by contacts that are electrically conductive but thermally insulating. The use of such connecting contacts is necessary to prevent the thermal energy produced in the absorbent surface of the infrared radiation from being sent to the semiconductive substrate, which would have the effect of degrading the operating characteristics of the CCD multiplexer.

Another embodiment is described in the article of M. OKUYAMA et al., "PYROELECTRIC IR-CCD IMAGE SENSOR," published in Ferroelectrics, 1989, vol. 91, pages 127-139. This document describes an infrared detector in which a detecting structure with a base of pyroelectric material is added to the CCD multiplexer, i.e., to the semiconductive substrate, by a dielectric layer which assures the thermal insulation.

FIG. 2 is a perspective view with a partial section. This FIGURE reproduces a FIGURE of the document cited above, showing the detecting structure with a base of pyroelectric material, connected to a semiconductive substrate by a dielectric coupling layer; the latter producing a thermal insulation between the substrate and the detecting structure.

In FIG. 2, semiconductive substrate SS carries a series of electrodes which constitutes an intermediate transfer circuit such as those mentioned with reference to FIG. 1. In a similar manner to that already explained with reference to FIG. 1, from an injection electrode referenced 50, the charges are transferred in the direction of transfer shown by arrow 4, in the direction of a column register stage (with four phases) represented by four electrodes referenced 51. As in the example of FIG. 1, direction of transfer 4 is parallel to the pixel lines: i.e., the series of electrodes shown in FIG. 2 relates to a single pixel, but in fact, such series of electrodes repeat to the left and to the right, and also in depth in the direction of the columns, to form a complete detector. The amount of charges transferred to stage 51 of the column register is controlled at the level referenced 52, which constitutes the input stage. These charges are then to be transferred in the direction shown by arrow 5, to be charged in a read register stage (not visible in FIG. 2) similar to that described with reference to FIG. 1.

Semiconductive substrate SS, and the series of electrodes that is repeated in the direction of the lines, and also at a right angle to the latter in the direction of the columns, constitute the CCD multiplexer part, on which detecting structure SD is peaced.

The detecting structure comprises a layer of pyroelectric material MP, itself covered by a layer AI intended to absorb the infrared radiation. In this embodiment, the pyroelectric zones or pixels are embodied by metal electrodes (not shown in FIG. 2) formed on the layer of pyroelectric material, on the side of the semiconductive substrate. The detecting structure is not in contact with the electrodes of the CCD multiplexer, from which it is insulated electrically and thermally by a layer of a dielectric coupling material MC and by an insulating layer of $SiO_2$; coupling layer MC being in contact with the pyroelectric material and the insulating layer being in contact with electrodes It should be noted that the coupling between the detecting structure and the CCD multiplexer is made more significant at the level of input stage 52, by the fact that the insulating $SiO_2$ layer is interrupted at the level of this input stage to leave room for dielectric coupling layer MC.

Such an embodiment exhibits an advancement, in particular in that it does not require using contacts that are electrically conductive and thermally insulating between the semiconductive substrate and each pyroelectric zone corresponding to a pixel. However, although advantageous, this embodiment still exhibits drawbacks attached to hybrid type structures, because, actually, the CCD multiplexer, on the one hand, and the detecting structure, on the other hand, are produced separately.

A much more striking improvement of the infrared detectors with a base of pyroelectric material results from using pyroelectric materials having low thermal conductivities k, for example, less than 1 W/m.K. Such a use of pyroelectric materials with low thermal conductivities is described in a French patent application no. 89 08799, now U.S. Pat. No. 5,087,816. This document indicates that it is possible to use polymers (for which generally k is less than 0.2 W/m.K) such as:
— polyvinylidene fluoride (PVDF),
— polyvinylidene fluoride - trifluoroethylene (PVDF-TrFE),
— polyvinylidene fluoride - vinyl acetate (PVDF-VAc),
— polyvinylidene cyanide - vinylidene fluoride (PVDCN - VDF).

It is generally possible to use composite materials (for which k is less than 1 W/m.K) such as mineral charge compounds of great thermal conductivity mixed in a polymer matrix of low thermal conductivity. For example, 60% by weight of PZT in polyimide gives a coefficient k of about 0.9 W/m.K.

The advantage of such a pyroelectric material with low thermal conductivity resides in that it can constitute the detecting surface by an approximately uniform layer able to be produced or deposited on the semiconductive substrate already carrying the CCD multiplexer. In fact, the pyroelectric layer is produced on electrodes whose surface and position approximately define the surface and the position of a pyroelectric zone corresponding to a pixel.

Each of these electrodes, called "lower electrode" in the description below, thus constitutes one of the plates of a pyroelectric capacitor to which each pixel or pyroelectric zone can be compared; the other plate of the pyroelectric capacitor can be constituted on the other face of the pyroelectric layer, for example, by an electrically conductive layer forming an electrode called upper electrode and which is common to all the pyroelectric zones.

Infrared detecting units with a base of pyroelectric material are thus produced having a monolithic structure, and whose production is then considerably simplified.

Relative to the hybrid structure shown in FIG. 2, such a monolithic infrared detector can comprise the same semiconductive substrate and a similar series of electrodes to constitute a CCD multiplexer similar to the one in FIG. 2. On the other hand, the layer of pyroelectric material with low thermal conductivity, although produced or deposited on the CCD multiplexer, can appear in a manner similar to that of the pyroelectric layer of FIG. 2; except for the fact that while, as in the hybrid type embodiment, the layer of pyroelectric material rests on the semiconductive substrate by a dielectric coupling layer MC, while in the case of the monolithic structure, coupling layer MC is replaced by an electrically conductive layer intended to form the lower electrode mentioned above.

However, in the case of the monolithic infrared detector having a layer of pyroelectric material with low thermal conductivity, since this layer is produced directly on the semiconductive substrate, it is necessary to subject it to a so-called "polarization" operation, intended to produce the crystalline orientation. This polarization consists in applying, between the two electrodes of each pyroelectric capacitor or pyroelectric zone, an electric voltage having a suitable polarity and an amplitude which can reach, for example, 1000 volts per 10 micrometers of thickness of the pyroelectric material.

The polarization of the pyroelectric material, within the framework of a monolithic infrared detector, exhibits the drawback of not being very simple to produce, because it requires gaining access to all the lower electrodes of all the pyroelectric capacitors. For this purpose, it is possible, for example, with standard microlithography techniques, to connect all the lower electrodes to one another and to an outer electrode, then to apply the polarization voltage between this outer electrode and the upper electrode mentioned above; then, next by the microlithography techniques, to eliminate the connections between all these lower electrodes to make possible the normal operation of all the pyroelectric capacitors.

This solution is certainly achievable, but it is long, delicate, and consequently costly.

Another problem attached to the infrared monolithic type detector lies in the fact that, relative to other pyroelectric materials, for the same thermal energy, the amount of electric charges produced by the pyroelectric materials with low thermal conductivity is clearly smaller, and as a result does not make it possible to obtain as good a thermal resolution.

SUMMARY OF THE INVENTION

The invention applies to infrared monolithic type detectors with a base of pyroelectric materials, i.e., of the type in which the pyroelectric layer is formed on the semiconductive substrate, and it applies particularly (but not exclusively) in the case of pyroelectric materials with a low thermal conductivity coefficient. It has as its object to facilitate the polarization operation of the pyroelectric material. It further makes it possible to eliminate the problems of thermal resolution, problems posed in particular in the case of pyroelectric materials with low thermal conductivity, because of their low response coefficient.

According to the invention, an infrared monolithic type detector includes a layer of pyroelectric material and a semiconductive substrate with the pyroelectric layer having a plurality of pyroelectric zones, each pyroelectric zone including a lower electrode located between the pyroelectric layer and the semiconductive substrate. The device is characterized in that it further includes a switching structure making it possible to establish an electric current between each lower electrode and the semiconductive substrate.

BRIEF DESCRIPTION OF THE DRAWINGS

The invention will be understood better from reading the following description, given by way of nonlimiting example with reference to the accompanying figures, of which.

DETAILED DESCRIPTION OF THE PREFERRED EMBODIMENTS

Figure 1:
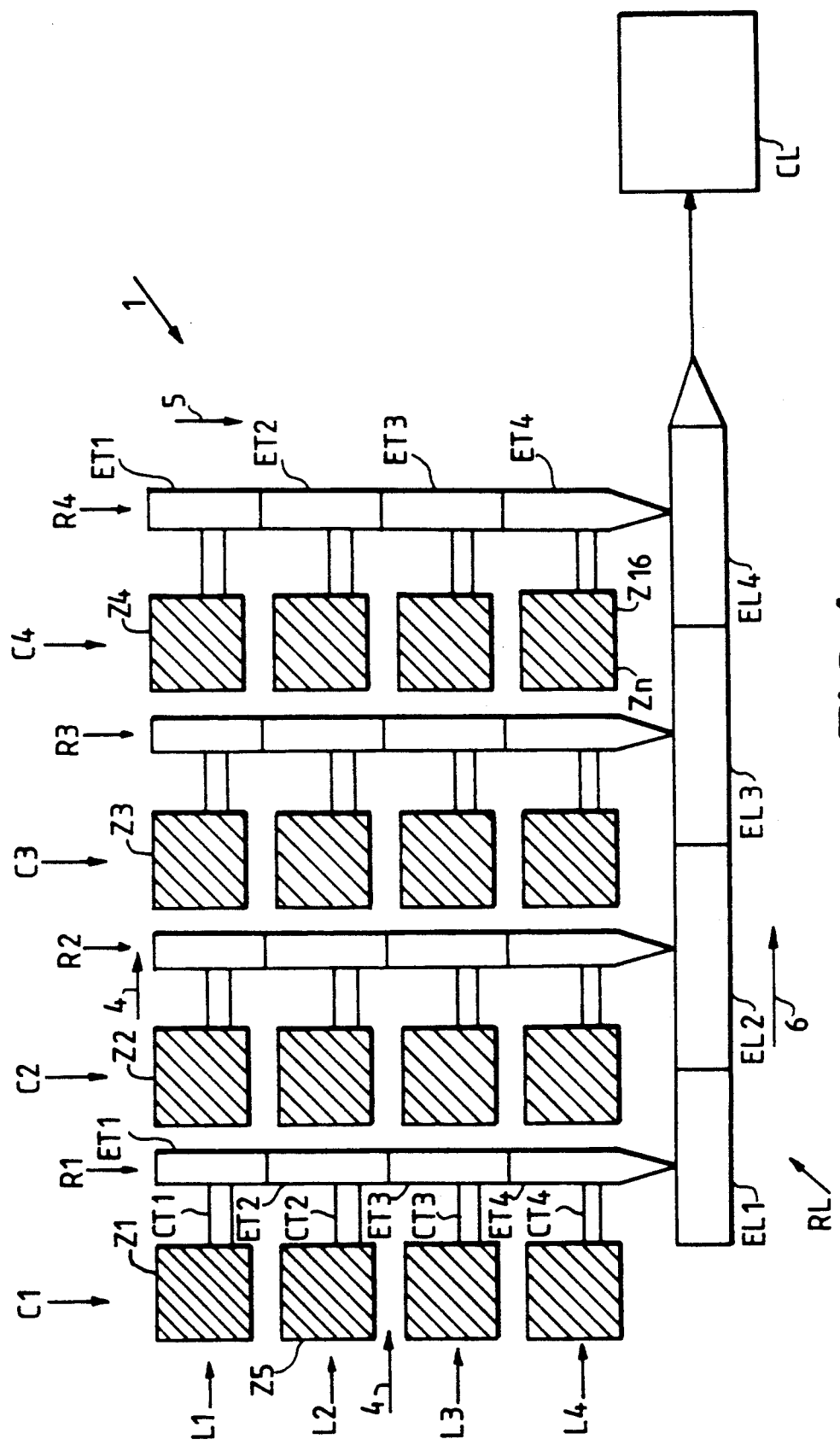
FIG. 1, already described, illustrates the operation of a detecting structure associated with a CCD multiplexer.
Figure 2:
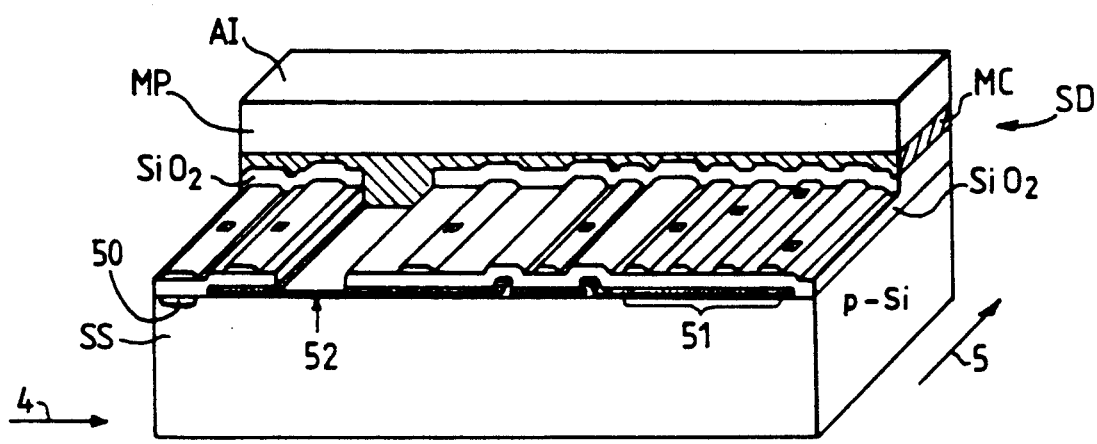
FIG. 2, already described, represents an infrared hybrid type detector according to the prior art.
Figure 3:
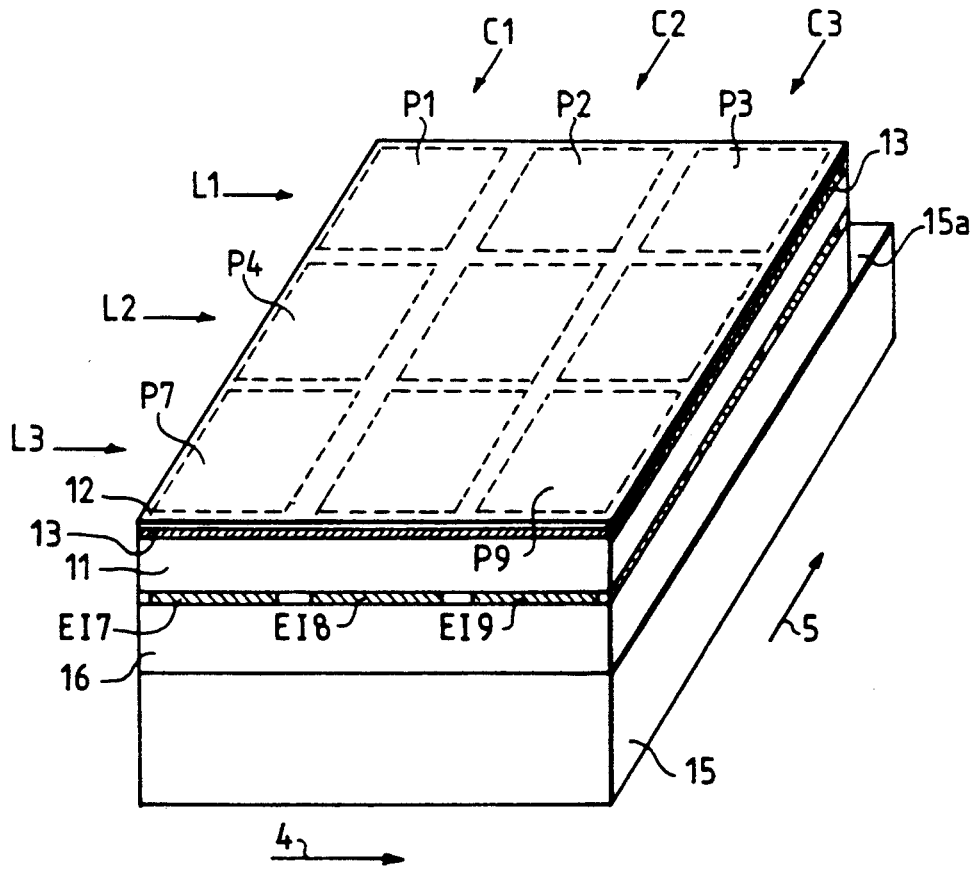
FIG. 3 is a perspective view which shows the general organization of an infrared monolithic type detector with a base of a pyroelectric material according to the invention.

Referring now to the drawings, wherein like reference numerals designate identical or corresponding parts throughout the several views, and more particularly to FIG. 3 thereof, there is shown the general organization of an infrared detector 10 according to the invention. The infrared detector includes a pyroelectric layer 11 of the low thermal conductivity coefficient type. Pyroelectric layer 11 is made sensitive to the infrared radiation with a layer 12 of a material absorbing the infrared, standard in the art. Pyroelectric layer 11 is coated with an electrically conductive layer 13, which constitutes an electrode called upper electrode 13 in the description below.

Absorbent layer 12 is placed above upper electrode 13 and in contact with the latter, so that the thermal energy produced by the infrared radiation is applied to pyroelectric layer 11.

Pyroelectric layer 11 is divided into a plurality of elementary zones or pixels Pi to P9 placed in lines L1 to L3 and in columns C1 to C3.

In the nonlimiting example described, and to simplify the description, only three columns C1 to C3 and three lines L1 to L3 are represented, forming nine pixels; but these lines and columns can be of different numbers, much larger or even smaller, for example, so as to comprise a single line or column to constitute a strip.

Layer 11 of pyroelectric material is formed by a uniform layer and in the nonlimiting example described, pixels P1 to P9 are each defined with an electrode called lower electrode EI 1 to EI 9 whose position and dimension define the position and the dimension of the pixel. These lower electrodes are placed on one face of pyroelectric layer 11 opposite upper electrode 13, and in the example of FIG. 3, only three lower electrodes EI 7, EI 8, EI 9 are represented, which correspond respectively to pixels P7, P8, P9.

Pyroelectric layer 11 is produced on a semiconductive substrate 15, and in the nonlimiting example of the description, it is separated from the latter by a relatively thick, electrically insulating layer 16 (on the order of, for example, 10 micrometers), for example of polyimide. As will be explained in more detail with reference to FIG. 4, insulating layer 16 has as its function to reduce the coupling between pyroelectric layer 11 and certain electrodes (not represented in FIG. 3) that substrate 15 comprises to form a CCD multiplexer. But, of course, in the spirit of the invention, pyroelectric layer 11 can be deposited or produced directly on substrate 15 or by a not very thick electrically insulating layer, of silicon oxide, for example.

Layer 11 of pyroelectric material is of a type such as that cited in the introductory section, so as to exhibit a low thermal conductivity. The depositing of the pyroelectric layer can be achieved, for example, by centrifuging a solution of polymers in a solvent, according in particular to a method known under the name "tournette method."

It is possible to deposit several layers of pyroelectric polymers to produce layer 11, which can thus easily have a thickness between 5 and 60 micrometers, for example:

Upper electrode 13 can then be produced, for example, by depositing a layer of aluminum on pyroelectric layer 11 by vacuum evaporation, for example.

Infrared absorbent layer 12 is then deposited, for example aluminum black by evaporation of aluminum according to a standard technique.

As will be explained in more detail with reference to FIG. 4, the polarization of the pyroelectric material forming layer 11 can be performed as soon as upper electrode 13, which is common to all pixels P1 to P9, is produced.

The thermal energy produced by the infrared radiation during an exposure period produces charges in the layer of pyroelectric material. For each pixel P1 to P9, the charges produced as a function of the infrared radiation are collected by a lower electrode EI 1 to EI 9. Each lower electrode is connected to an input stage (not represented) of an intermediate transfer circuit (whose function is similar to those mentioned in the introductory section). As soon as the period of exposure to the infrared radiation is ended, these charges called signal charges are transferred, in direction of transfer 4, to be charged in a stage of a column register (not represented); they are then transferred in a way standard in the art by the column registers in direction of transfer 5, toward a read register then toward a read circuit.

The various intermediate transfer circuits, the various column registers, the read register and the read circuit constitute a CCD multiplexer (not represented) formed in a standard way on semiconductive substrate 15; the read register and the read circuit are symbolized in the FIGURE by a zone 15a of semiconductive substrate 15.

Figure 4:
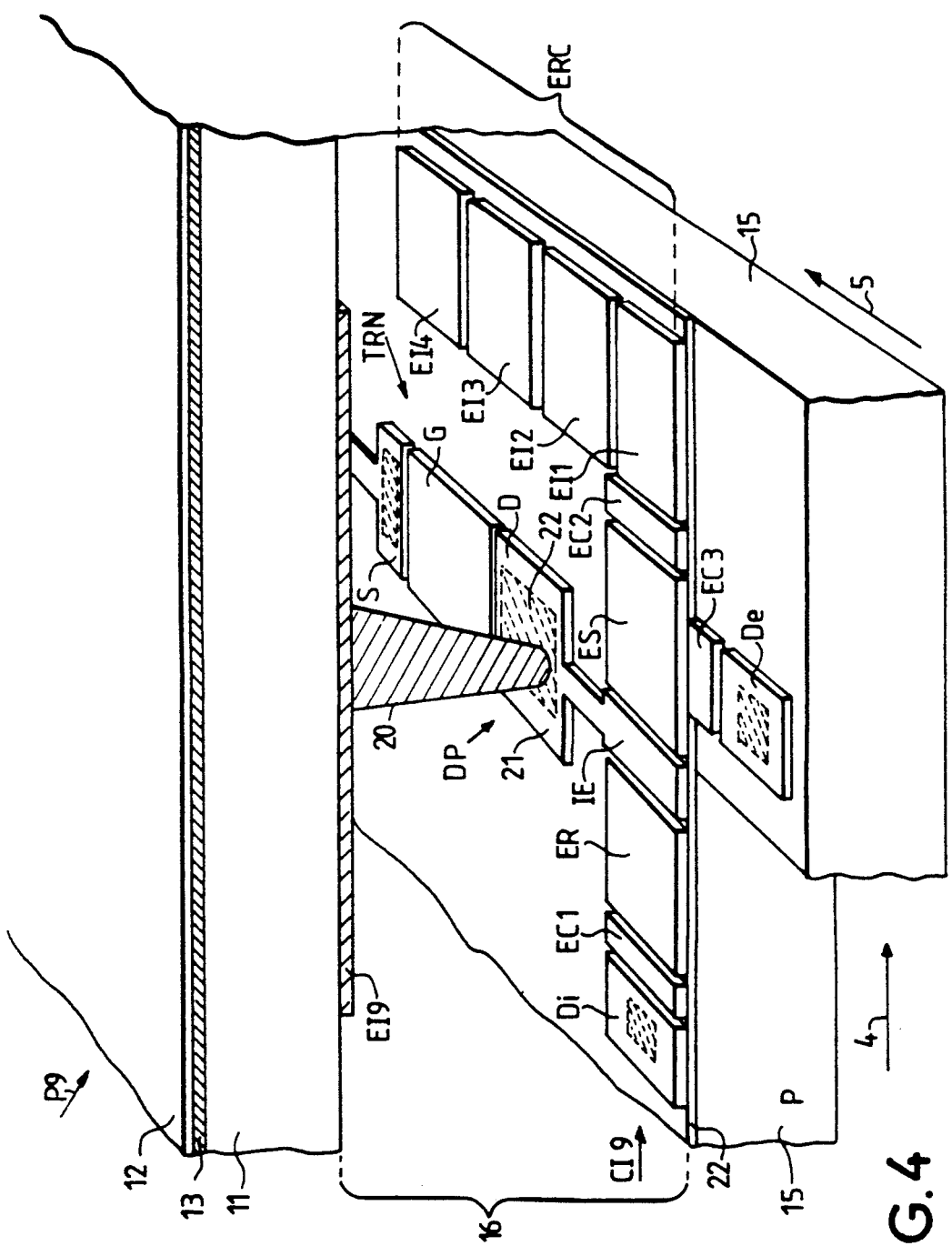
FIG. 4 diagrammatically represents the elements of a pixel already shown in FIG. 3, in an arrangement according to the invention.

FIG. 4 is a perspective view which shows in more detail the elements relative to a single pyroelectric zone or pixel, pixel P9, for example. In FIG. 4, insulating layer 16 has not been represented, i.e., it does not appear in the location reserved for it, to free and to show the upper face of substrate 15, and to represent an arrangement of electrodes according to the invention.

Lower electrode EI 9 determines in pyroelectric layer 11 a pyroelectric zone specific to ninth pixel P9. Lower electrode EI 9 is connected by a vertical metal-coating 20 to an input electrode IE of an input stage belonging to an intermediate transfer circuit CI 9, produced on semiconductive substrate 15. Vertical metal-coating 20 corresponds, for example, to a hole made in insulating layer 16. This metal-coating ends in a conductor 21 connected to input electrode IE and which is formed at the surface of semiconductive substrate 15, more specifically on an insulating layer 22 of silicon oxide, for example, which, in a way standard in the art, performs the electrical insulation between the various electrodes and semiconductive substrate 15.

Lower electrode EI 9 is connected to input electrode IE, and the signal charges (or amounts of charges proportional to these signal charges) are transferred by intermediate transfer circuit CI 9 in direction of transfer 4.

In the nonlimiting example described, intermediate transfer circuit CI 9 comprises the following elements, enumerated from the left of FIG. 4 to the right, i.e., in direction of transfer 4:

—A charge injection diode Di, standard in the art: it is constituted in semiconductive substrate 15 with an implant (represented by a hachured rectangle, in dotted lines) of a type of conductivity opposite to that of the semiconductive substrate; semiconductive substrate 15 being doped, for example, with type P, while the implant is of type N, with phosphorus, for example.

—a control electrode EC1 intended to enable the passage of charges produced by injection diode Di;

—control electrode EC1 is followed by a so-called "reference" electrode ER;

—input electrode IE of the input stage;

—an electrode known as storage electrode ES which represents a storage stage;

—storage electrode ES is followed by a second control electrode EC2 enabling the passage of charges stored in storage stage ES;

—a stage ERC of a register column intended to transfer the charges coming from the storage stage; this transfer is performed in direction of transfers 5, according to a mode of operation which has been explained above in the introductory section in connection with registers known as "column registers" used in the CCD multiplexers.

In the nonlimiting example described, stage ERC belongs to a column register of the four-phase type, i.e., that each of its stages, and in particular stage ERC, comprises four intermediate stages EI 1, EI 2, EI 3, EI 4, which for the transfer of charges are actuated by transfer control signals (not shown) having different phases, to produce under each of the intermediate electrodes a series of potential wells and barriers; this series being suitable to perform the transfer of charges in the direction shown by arrow 5.

In the absence of these transfer control signals, the charges coming from storage stage ES can be stored, for example, in first intermediate stage EI 1.

It should be noted that intermediate transfer circuit CI 9 further comprises a charge evacuation diode De, and a third control electrode EC3, placed at the same level as storage stage ES. This evacuation diode De can be constituted in the same manner as injection diode Di, and its function is to eliminate, or to evacuate in some cases, charges contained in a potential well of the storage stage, as is explained in more detail in a continuation of the description given with reference to FIGS. 5a and 5b. Third control electrode EC3 is intended to enable the passage of charges from the storage stage to evacuation diode De.

According to a characteristic of the invention, lower electrode EI 9 is electrically connected to semiconductive substrate 15 by a switching means which makes possible the passage of an electric current between the semiconductive substrate and lower electrode EI 9.

In the nonlimiting example described, this switching means is a diode DP called polarization diode, produced by an implant 22 (represented by a hachured rectangle in dotted lines) of a material exhibiting a conductivity type (N) opposite to that of the semiconductive substrate, for example, phosphorus.

Conductor 21, on which vertical metal-coating 20 ends, is located above implant 22 being used to form polarization diode DP, to connect diode DP electrically to lower electrode EI 9.

This produces an electrical connection between semiconductive substrate 15 and lower electrode EI 9, a connection which makes possible the passage of the current in only one direction.

In the nonlimiting example described where the conductivity of semiconductive substrate 15 is of type P, and implant 22 is of type N, this implant constitutes the cathode of polarization diode DP, and a current can pass through this diode if the semiconductive substrate is brought to a positive potential relative to that of lower electrode EI 9.

Polarization diode DP is intended to make possible the polarization of the pyroelectric material which constitutes ninth pixel P9. This polarization can thus be achieved in a very simple way, by applying an electric voltage on the order of 1000 volts, for example, between semiconductive substrate 15 and upper electrode 13, with the positive potential to the semiconductive substrate. All lower electrodes EI 1 to EI 9 of all pixels P1 to P9 being also connected to semiconductive substrate 15 by a polarization diode similar to the one shown in FIG. 4, and upper electrode 13 being common to all pixels P1 to P9, the polarization of all the pixels can be achieved by the same operation.

The presence of polarization diode DP can disturb the operation, during the exposure period where charges are produced in the pyroelectric material under the action of a thermal energy.

Figures 5A, 5B:
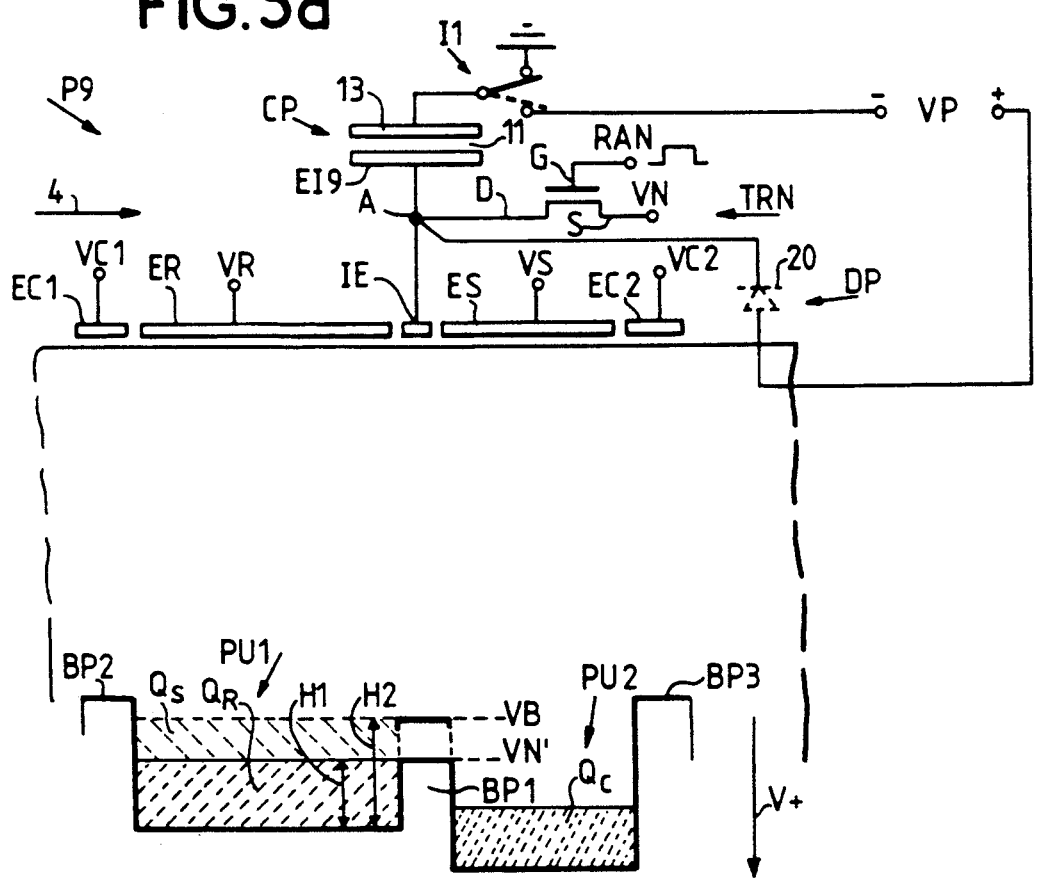
FIG. 5a is an electrical diagram of the elements represented in FIG. 4.
FIG. 5b is to be read in connection with FIG. 5a, and represents potential wells created in a semiconductive substrate.

For the purpose in particular of eliminating this drawback, and according to another characteristic of the invention, lower electrode EI 9 and as a result, input electrode IE and implant 22 forming the cathode of diode DP, are connected to a second switching means whose operation is explained in a continuation of the description relative to FIGS. 5a and 5b.

In the nonlimiting example described, the second switching means is a "MOS" type transistor, which is called reset-to-level transistor TRN.

Transistor TRN is produced in semiconductive substrate 15 in a way standard in the art, for example, with an N type implant to form source S, and another N type implant to form drain D; the conduction in the space formed between drain D and source S is controlled by an electrode which constitutes gate G of transistor TRN.

The latter has a switching function, and one of its ends, drain D, for example, is connected electrically to input electrode IE, to lower electrode EI 9, and the cathode of diode DP.

For this purpose, in the nonlimiting example described, N type implant 22, which constitutes the cathode of diode DP, also constitutes drain D of transistor TRN.

For greater clarity of FIG. 4, the conductors, standard in the art, that are used to convey the various signals and the various voltages necessary for the operation have not been represented, said signals and voltages will be explained with reference to FIGS. 5a and 5b.

Of course, other relative positions can be imparted to various elements which, in FIG. 4, are added to semiconductive substrate 15, the important thing being, on the one hand, that a switching means (DP) be produced, of diode or transistor or switch or even relay type, a means which makes possible the circulation of a current between semiconductive substrate 15 and lower electrode EI 9; and, on the other hand, that a second switching means (TRN) can be controlled, during certain sequences of the operation, to apply a given voltage level to lower electrode EI 9 (and the elements which are connected to it). It should be noted further that electrically insulating layer 16, which separates lower electrode EI 9 and the semiconductive substrate, can comprise a significant thickness as in the example shown in FIG. 4, for example, a thickness on the order of 20 micrometers, to reduce the coupling between lower electrode EI 9 and the various electrodes formed on the semiconductive substrate. In the spirit of the invention, however, the thickness of insulating layer 16 could be reduced to a value sufficient to assure electrical insulation, for example, on the order of 1 micrometer.

FIG. 5a is an electrical diagram of the elements shown in FIG. 4, which is relative to pixel P9. But, of course, this electrical diagram also applies to all other pixels P1 to P8.

In FIG. 5a, polarization diode DP is represented in dotted lines in semiconductive substrate 15, and its cathode (20) is connected at a connecting point A common to input electrode IE, drain D of reset-to-level transistor TRN, and lower electrode EI 9. Lower electrode EI 9 and the upper electrode are represented as the plates of a capacitor CP, known as pyroelectric capacitor, whose dielectric consists of the pyroelectric material forming pixel P9.

As has been stated above, polarization diode DP makes possible the passage of a current between semiconductive substrate 15 and the lower electrode, to perform the polarization of the pyroelectric material.

For this purpose, it is sufficient to apply, with the polarity compatible with the direction of conduction of polarization diode DP, a polarization voltage VP. In the example represented in FIG. 5, negative polarity −VP is applied to upper electrode 13, and positive polarity +VP is applied to semiconductive substrate 15, as well as to lower electrode EI 9 where it is reduced from the voltage drop due to the threshold of polarization diode DP.

For a better understanding, in FIG. 5a, the voltage supply of upper electrode 13 is achieved by a switching element II in two positions, one of which corresponds to the application of the negative potential of polarization voltage VP, and the other corresponds to the application of a potential approximately equal to that of substrate 15. But in practice, the polarization of the pyroelectric material is located at a stage which precedes that of the operation, and it therefore is not necessary to provide such a switch.

In operation, polarization diode DP can distort the measurements, in that it can drain off the charges produced in pyroelectric capacitor CP, charges which are collected by lower electrode EI 9. Actually, the accumulation of negative charges on lower electrode EI 9 has the effect of producing a negative variation of the potential of the latter. Also, if the potential difference between the semiconductive substrate and the lower electrode reaches the conduction threshold of polarization diode DP, the latter drains off the charges to substrate 15.

In this invention, this drawback is avoided with reset-to-level transistor TRN. Source S of the latter is connected to the positive potential of a voltage VN, called reset-to-level voltage. In practice, reset-to-level voltage VN can have a value on the order of 5 to 6 volts, for example, relative to the potential of semiconductive substrate 15.

Semiconductive substrate 15 and the upper electrode are connected to the same potential, the potential of the ground, for example. Under these conditions, a reset-to-level control signal RAN, consisting, for example, of a voltage square pulse during the period in which transistor TRN is made conductive, is applied to control gate G of transistor TRN:

—as a result, the reset-to-level voltage is applied to lower electrode EI 9, which has the effect of charging pyroelectric capacitor CP at the value of reset-to-level voltage VN (on the side of lower electrode EI 9), the other plate (upper electrode 13) of pyroelectric capacitor CP and semiconductive substrate 15 being grounded, polarization diode DP is in a blocked state.

Of course, while reset-to-level transistor TRN is conductive, i.e., during the reset-to-level phase, no charge is accumulated in pyroelectric capacitor CP.

The operation of the infrared detector can be, for example, such that the reset-to-level control, applied to gate G of transistor TRN, stops slightly before the moment when the exposure of the pixels to a radiation begins: with the end of the reset-to-level control signal, reset-to-level transistor TRN passes from the conductive state to the blocked state, and consequently connecting point A, common to lower electrode EI 9 and input electrode IE and the cathode of polarization diode DP, constitutes a point with floating potential. If charges are created in pyroelectric capacitor CP (which represents the pyroelectric zone of pixel P9) when reset-to-level transistor TRN is not conductive, i.e., when point A is at floating potential, these charges cause a negative variation of the potential of point A, a potential which starting from the positive value of reset-to-level voltage VN tends to diminish and to draw closer to the potential of the ground, i.e., the potential of semiconductive substrate 15.

Consequently, polarization diode DP is blocked as long as the point at floating potential A is at a potential that is more positive than or equal to that of semiconductive substrate 15; so that polarization diode DP does not at all disturb the accumulation of the charges which constitute the signal charges.

The operation described above corresponds to an acquisition or reading of the signal charges according to a mode called "voltage reading."

In a standard way, the reading of the signal charges is performed according to two main methods, one of which is the so-called charge reading and the other is the voltage reading.

The principle of the charge reading is described in a very detailed way in the article of R. WATTON et al. "The pyroelectric/CCD focal plane hybrid: Analysis and design for direct charge injection," published in Infrared Phys. vol 22, pages 259 to 275, 1982.

The charge reading consists in directly injecting the charges in a CCD type shift register. The pyroelectric capacitor is reset to level after each reading.

In the voltage reading method, the voltage of the pyroelectric capacitor is used to modulate a gate or electrode of a CCD stage. The modulation of the voltage of this electrode causes a modulation of the height of a potential barrier in the substrate. The pyroelectric capacitor can then be discharged with a "chopper" device, which makes it possible to insert an absorbent screen between the source of the infrared radiation and the infrared detector outside the exposure periods, so that since no thermal energy is transmitted to the pyroelectric material, the latter regains the temperature that it comprised before the period of exposure to the radiation.

The voltage reading method exhibits the advantage of imparting to the detector unit a signal to noise ratio that is much greater than the charge reading method, and therefore of obtaining a better thermal resolution. This is so particularly if the charges accumulated in the pyroelectric capacitor are eliminated during the exposure to the radiation, by allowing the pyroelectric material to return to its initial temperature (with a chopper device), and not by applying to the pyroelectric capacitor a reset-to-level voltage with a switching means able to produce a significant noise.

In this invention, the reading is of the "voltage" type, and it is performed according to a so-called differential method, which tends to eliminate the reset-to-level noise produced by the switching means that transistor TRN constitutes.

The beginning of an operation cycle can consist in a resetting to level of pyroelectric capacitor CP. For this purpose, as has been explained above, reset-to-level transistor TRN is made conductive, and positive reset-to-level voltage VN is applied at point A, and therefore to input electrode IE. At the same time, reference electrode ER and storage electrode ES receive respectively a reference voltage VR and a so-called storage voltage VS, these reference and storage voltages VR and VS being more positive than reset-to-level voltage VN.

On the other hand, first and second control electrode EC1, EC2 receive control voltages VC1, VC2 respectively more negative than reset-to-level voltage VN. Potential wells and barriers, which are illustrated in FIG. 5b, result in semiconductive substrate 15.

FIG. 5b shows the potential wells and the potential barriers produced in semiconductive substrate 15, by the application of the voltages enumerated above; in FIG. 5b, an arrow V+symbolizes the fact that the positive potentials go steadily downward, according to a representation usual in the field of charge transfer circuits.

Since input electrode IE is more negative than reference and storage electrodes ER, ES, a potential barrier BP1 is produced under input electrode IE. This potential barrier separates two potential wells, the first PU1 of which is formed under reference electrode ER, and the second PU2 of which is formed under storage electrode ES. The control potential applied to first control electrode EC 1 determines under the latter a second potential barrier BP2, and second control electrode EC2 determines a third potential barrier BP3. Thus, by following direction 4 of transfer of the charges, there is successively second potential barrier BP2, then first potential well PU1 (under the reference electrode), then first potential barrier BP1 (under input electrode IE), then second potential well PU2, and finally third potential barrier BP3.

As long as reset-to-level voltage VN is applied to point A with floating potential, the potential under control electrode IE is at a value VN' which corresponds to the top of first potential barrier BP1. Potential VN' defines a height H1 at potential barrier BP1, and this height H1 represents the depth of first potential well PU1; this mean that the height of first potential barrier BP1 determines the amount of charges able to be stored in first potential well PU1.

Height H1 of potential barrier BP1 is connected to reset-to-level voltage VN which has a constant value. However, the height of the potential barrier can be modulated by a noise introduced by reset-to-level transistor TRN. To eliminate this noise during the reading of a signal charge, according to a characteristic of the invention, a charge amount equal to or greater than the amount that first potential well PU1 can contain is injected in the latter, just after the application of reset-to-level voltage VN at point A with floating potential and before the beginning of the exposure period. For this purpose, it is possible, for example, to control first control electrode EC1 to lower second potential barrier BP2, and to make it possible to divert into first potential well PU1 an amount of charges produced upstream from second potential barrier BP2, for example, by injection diode Di shown in FIG. 4. First potential well PU1 then contains an amount of filling charge QR; and the amount of charge optionally in excess (not represented) passes above first potential barrier BP1 to go into second potential well PU2, from which these charges are then evacuated, with, for example, evacuation diode De shown in FIG. 4, in a manner standard in the art.

This operation makes it possible, between the reset-to-level phase and the exposure period, to fill first potential well PU1 to a height H1 which is defined by potential barrier BP1, and which takes into account the value of the noise introduced by reset-to-level transistor TRN.

At the moment of the beginning of the period of exposure to a radiation, point A is a point with floating potential (reset-to-level transistor TRN not being conductive from the reset-to-level phase). If charges are generated in pyroelectric capacitor CP, they produce a negative variation of the voltage at point A, a variation which is reflected in semiconductive substrate 15, under input electrode IE where the potential then passes to a new value VB that is more negative, so that potential barrier BP1 then comprises a second height H2 that is greater than first height H1. Since the two heights H1, H2 each contain the same value of the noise introduced by transistor TRN, the difference of height H2 −H1 is only proportional to the value of the signal charge produced during the exposure.

An amount of driving charge Q0 is then injected in first potential well PU1, for example with injection diode Di and by controlling second potential barrier BP2 as in the preceding example. According to a characteristic of the invention and according to a first version of the process, driving charge Q0 has a value that is known and greater than the amount of charges necessary to fill first potential well PU1 completely after the end of the exposure period, i.e., after first potential barrier BP1 has reached second height H2. Driving charge Q0 is separated into a first and a second fraction $Q_s$ and $Q_c$: first fraction $Q_s$ is proportional to the signal charge, it remains in first potential well PU1 to make up the difference between second height H2 and first height H1; second fraction $Q_c$ is an additional amount which is diverted into second potential well PU2 and which represents the addition necessary for fraction $Q_s$ to obtain driving charge Q0. Since driving charge Q0 has a known value, it is then sufficient to transfer to a read circuit additional charge $Q_c$ contained in the second potential well, to be able to determine the value of charge amount $Q_s$ representing the signal charge. It should be noted that further, an improvement of the signal to noise ratio depends on the ratio of the capacities between the pyroelectric capacitor CP and the capacitor associated with reference electrode ER, and that this improvement is all the greater the larger the capacitor associated with reference electrode ER is relative to pyroelectric capacitor CP.

It is then possible to eliminate all the charges contained in first potential well PU1, and to begin a cycle according to a manner similar to that explained above, i.e., by reapplying reset-to-level voltage VN to lower electrode EI 9 by making reset-to-level transistor TRN conductive.

But, it is also possible to confirm the measurement of a signal charge by a direct reading of charge amount $Q_s$, charge amount $Q_s$ which represents the height difference of potential barrier BP1. For this purpose, it is sufficient to allow the pyroelectric material which constitutes pyroelectric capacitor CP the time to regain its starting temperature, i.e., the temperature that it comprised before the exposure period. Actually, with the cooling of pyroelectric capacitor CP, the potential of floating point A shows a positive variation, a positive variation which is reflected by a reduction of the height of first potential barrier BP1 with the cooling of pyroelectric capacitor CP, the height of potential barrier BP1 decreases and causes the gradual diverting into second potential well PS of charges $Q_s$ previously contained in first potential well PU1; and at the end of the cooling period of pyroelectric capacitor CP, all the charges of fraction $Q_s$, which is representative of height difference H2−H1, i.e., representative of the signal charge, are transferred into second potential well PU2. It is then sufficient to transfer the charges contained in second potential well PU2 to a read circuit to read these charges and to know their value.

However, the amount of these charges $Q_s$ can be relatively small and their reading can present some difficulties. In this case, preferably (but not imperatively), when the pyroelectric material of pyroelectric capacitor CP is completely cooled, it is possible to inject a second driving charge Q0 in first potential well PU1. Since the latter is already completely filled, the entire driving charge Q0 is diverted into second potential well PU2, where it is added to fraction $Q_s$ which represents the signal charge. The entire charge amount contained in second potential well PU2, a charge amount which consists of driving charge Q0 to which is added the part of $Q_s$ that is representative of the signal charge, is then transferred to a read circuit (not represented).

The reading of additional charge part $Q_c$ performed at the end of the exposure period can be put into memory, then subtracted from charge amount $Q0+Q_s$, so that the result of this subtraction represents two times $Q_s$, first and second driving charges Q0 being cancelled. It is noted that according to this second method, the amount of driving charges Q0 need not be known.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the U.S. is:

1. An infrared monolithic type detector, comprising:
   a layer of pyroelectric material;
   a semiconductive substrate wherein the pyroelectric layer comprises a plurality of pyroelectric zones, each pyroelectric zone including a lower electrode located between the pyroelectric layer and the semiconductive substrate; and
   switching means, for establishing an electric current between each of said lower electrodes and the semiconductive substrate,
   wherein said semiconductive substrate comprises a CCD multiplexer having one input electrode for each of said pyroelectric zones, each one of said input electrodes being connected to said lower electrode, a polarization diode and a transistor, each input electrode being used to form a potential barrier in said semiconductive substrate.

2. A process of reading signal charges produced in pyroelectric zones or pixels in an infrared detector, each pyroelectric zone including a lower electrode whose potential varies proportionally to the signal charges produced during a period of exposure to a radiation of the infrared detector, the process comprising the steps of:
   producing in a semiconductive substrate a potential barrier between a first and a second potential well;
   imparting to said potential barrier a height proportional to the potential of lower electrode, the depth of first potential well being given by the height of the potential barrier;
   applying before a period of exposure to a radiation, a reset-to-level voltage to lower electrode;
   eliminating the application of the reset-to-level voltage and filling the first potential well; and
   beginning the exposure period;

injecting, after the exposure period, an amount of driving charges in the first potential well to divide the amount of driving charge into first and second fractions, with the first fraction representing the signal charge and being stored in first potential well and the second fraction being diverted and stored in second potential well and representing difference between driving charge and first fraction.

3. A process according to claim 2, wherein it consists in transferring to a read circuit second fraction contained in second potential well.

4. A process according to claim 3, wherein the amount of driving charges has a known value.

5. A process according to any one of claims 2, 3 or 4, further comprising the steps of:
allowing pyroelectric zones to cool to allow them to regain the same temperature as before the exposure period, so that first charge fraction is diverted into second potential well, and then;
transferring the first charge fraction to a read circuit.

6. A process according to any one of claims 2, 3 or 4, further comprising after the exposure period, injecting in fist potential well a second amount of driving charges, and then, after pyroelectric zones have returned to their temperature of before the exposure period, transferring to a read circuit the charges contained in second potential well so that the charges thus transferred consist of an amount of driving charges plus first charge fraction.

7. An infrared monolithic type detector, comprising:
a layer of pyroelectric material;
a semiconductive substrate wherein the pyroelectric layer comprises a plurality of pyroelectric zones, each pyroelectric zone including a lower electrode located between the pyroelectric layer and the semiconductive substrate, said detector further comprising
switching means, for establishing an electric current between each said lower electrode and the semiconductive substrate, said switching means including a polarization diode on said semiconductive substrate for controlling the flow of said electric current between the semiconductive substrate and lower electrode.

8. The infrared monolithic type detector according to claim 7, wherein said polarization diode function to control a polarization state of said pyroelectric layer.

9. The infrared monolithic type detector according to claim 7, wherein said polarization diode is formed in the semiconductor substrate and includes an implant of an element exhibiting a conductivity type opposite that of the semiconductive substrate.

10. The infrared monolithic type detector according to claim 9, wherein said polarization diode is connected to an input electrode of an intermediate transfer circuit and also to a transistor enabling the application of a reset voltage to each lower electrode.

11. The infrared monolithic type detector according to claim 10, wherein said implant constitutes a cathode electrode of said polarization diode, and wherein said electric current flows between the semiconductive substrate and the lower electrode when said semiconductive substrate is set at a higher potential than the lower electrode.

12. The infrared monolithic type detector according to claim 11, wherein the cathode electrode of said polarization diode and a drain electrode of said transistor are electrically connected at a common point.

13. The infrared monolithic type detector according to claim 12, wherein said polarization diode is in a blocked state if said common point is at a voltage potential greater than or equal to the potential of said semiconductive substrate.

14. The infrared monolithic type detector according to claim 7, further comprising a charge evacuation diode connected to said polarization diode through a control electrode.

* * * * *